United States Patent
Bhattacharyya (10) Patent No.: US 10,831,111 B2
(45) Date of Patent: Nov. 10, 2020

(54) METROLOGY METHOD AND LITHOGRAPHIC METHOD, LITHOGRAPHIC CELL AND COMPUTER PROGRAM

(71) Applicant: ASML NETHERLANDS B.V., Veldhoven (NL)

(72) Inventor: Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 220 days.

(21) Appl. No.: 16/073,362

(22) PCT Filed: Feb. 21, 2017

(86) PCT No.: PCT/EP2017/053877
§ 371 (c)(1),
(2) Date: Jul. 27, 2018

(87) PCT Pub. No.: WO2017/148738
PCT Pub. Date: Sep. 8, 2017

(65) Prior Publication Data
US 2019/0041760 A1    Feb. 7, 2019

(30) Foreign Application Priority Data

Mar. 3, 2016 (EP) .................................... 16158550

(51) Int. Cl.
*G03F 7/20* (2006.01)
(52) U.S. Cl.
CPC ...... *G03F 7/70633* (2013.01); *G03F 7/70616* (2013.01); *G03F 7/70625* (2013.01); *G03F 7/70641* (2013.01); *G03F 7/70683* (2013.01)
(58) Field of Classification Search
CPC ............. G03F 7/70633; G03F 7/70616; G03F 7/70625; G03F 7/70641; G03F 7/70683
USPC .................................................... 430/22, 30
See application file for complete search history.

(56) References Cited

U.S. PATENT DOCUMENTS

| | | |
|---|---|---|
| 2009/0186286 A1 | 7/2009 | Ausschnitt et al. |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2014/0065736 A1 | 3/2014 | Amir et al. |

FOREIGN PATENT DOCUMENTS

| | | |
|---|---|---|
| CN | 102498441 | 6/2012 |
| WO | 2009078708 | 6/2009 |
| WO | 2009106279 | 9/2009 |

OTHER PUBLICATIONS

Chinese Office Action issued in corresponding Chinese Patent Application No. 201780014743.6, dated Nov. 28, 2019.
International Search Report and Written Opinion issued in corresponding PCT Application No. PCT/EP2017/053887, dated Jul. 5, 2017, 11 pages.
Taiwanese Office Action issued in corresponding Taiwanese Application No. 106106889, with English translation, dated Jan. 15, 2018, 6 pages.
Ke, Chih-Ming, et al.: "Accuracy of diffraction-based and image-based overlay", Proc. of SPIE, vol. 7971, Mar. 17, 2011, 8 pages.
Korean Office Action issued in corresponding Korean Patent Application No. 10-2018-7027901, dated Mar. 23, 2020.

*Primary Examiner* — Christopher G Young
(74) *Attorney, Agent, or Firm* — Pillsbury Winthrop Shaw Pittman LLP (57) ABSTRACT

A method of measuring a target, an associated lithographic method, an associated computer program product and an associated litho cell is provided, wherein the method includes measuring the target subsequent to exposure of structures by a lithographic process in a current layer on a substrate over one or more preceding layers, wherein the one or more preceding layers have each undergone an etch step, and wherein the target is only in at least one of the one or more preceding layers. In this way, an after-etch measurement of the target can be obtained.

20 Claims, 3 Drawing Sheets

METROLOGY METHOD AND LITHOGRAPHIC METHOD, LITHOGRAPHIC CELL AND COMPUTER PROGRAM

CROSS-REFERENCE TO RELATED APPLICATIONS

This application is the U.S. national phase entry of PCT patent application no. PCT/EP2017/053877, which was filed on Feb. 21, 2017, which claims the benefit of priority of European patent application no. 16158550.0, which was filed on Mar. 3, 2016, and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay error (undesired misalignment of two layers).

More recently, integrated metrology has been devised. This comprises making inline measurements of parameters (e.g., overlay, focus or critical dimension) on substrates during the lithographic process. It would be desirable to improve on the accuracy of these measurements.

SUMMARY OF THE INVENTION

The invention in a first aspect provides a method of measuring a target comprising: measuring said target subsequent to exposure of structures by a lithographic process in a current layer on a substrate over one or more preceding layers, wherein said one or more preceding layers have each undergone an etch step, and wherein said target is comprised only in at least one of said one or more preceding layers, thereby obtaining an after-etch measurement of said target.

The invention in a second aspect provides a method of performing a lithographic process comprising: performing lithography steps to form structures in one or more preceding layers on a substrate, at least one of said preceding layers comprising a target; performing an etch step on said one or more preceding layers; exposing a current layer over said one or more preceding layers; and subsequent to these steps: measuring said target to obtain an after-etch measurement of said target.

The invention in a third aspect provides a lithographic cell comprising a lithographic apparatus and a metrology apparatus, said lithographic cell being operable to perform the method of the first aspect or the second aspect.

The invention further provides a computer program comprising processor readable instructions which, when run on suitable processor controlled apparatus, cause the processor controlled apparatus to perform the method of the first aspect or the second aspect, and a computer program carrier comprising such a computer program. The processor controlled apparatus may comprise the lithographic cell of the third aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
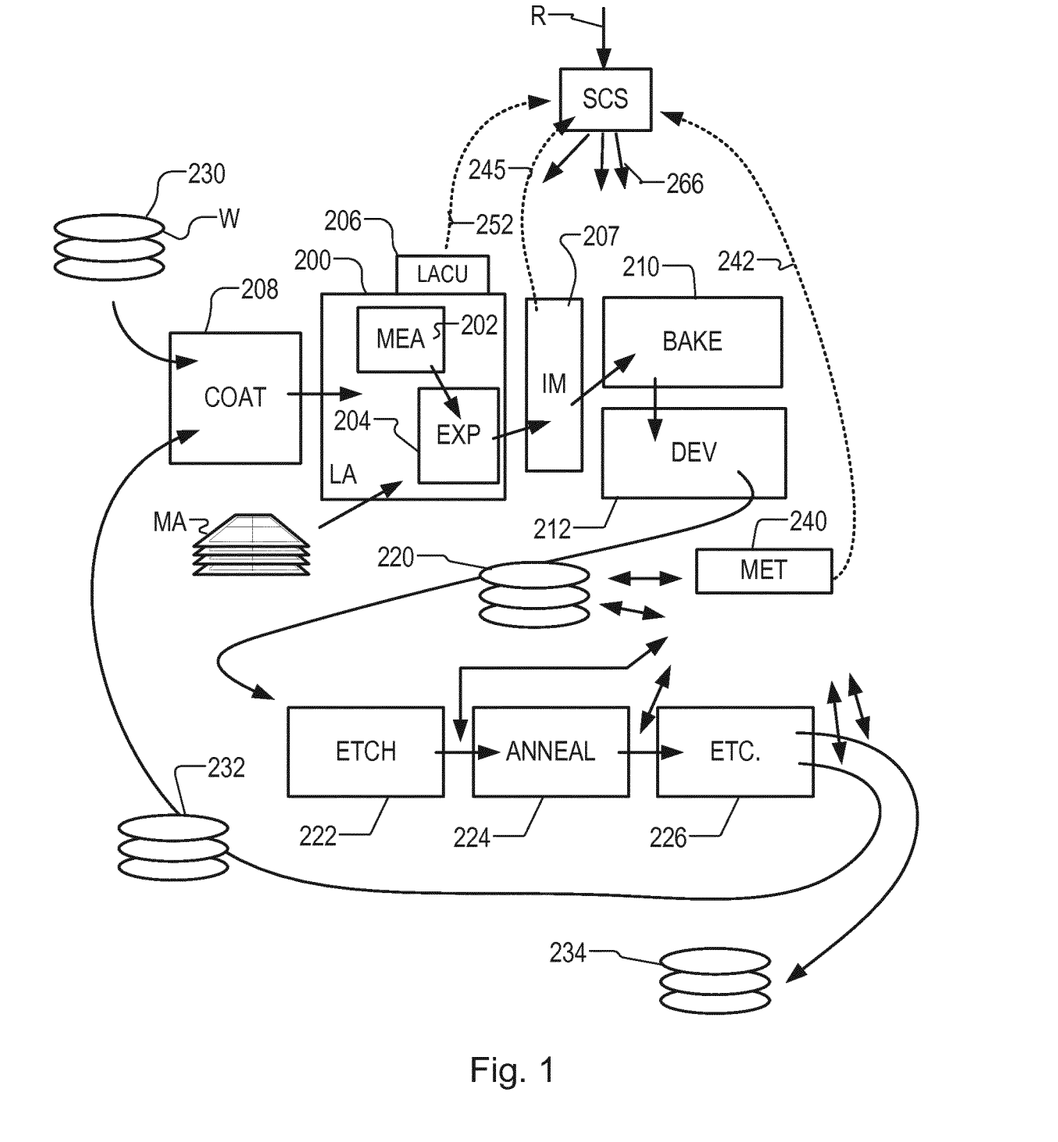
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 2:
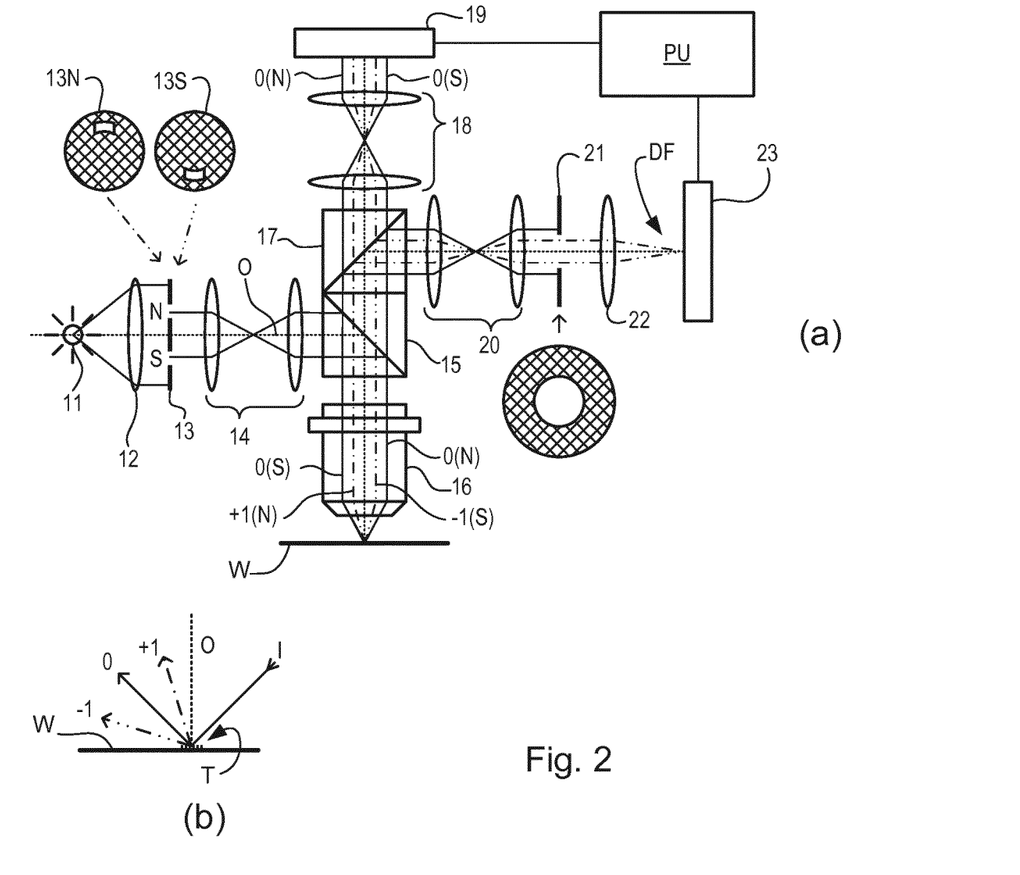
FIG. 2 comprises (a) a schematic diagram of a dark field scatterometer for use in measuring targets using a first pair of illumination apertures, (b) a detail of diffraction spectrum of a target grating for a given direction of illumination.

A metrology apparatus is shown in FIG. 2(*a*). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

In the above it is mentioned that metrology is normally performed immediately after the develop step and before etch, with the overlay target being measured in resist ("after-develop" overlay measurement), particularly when using an integrated metrology apparatus to perform inline measurement. This is because measurement after-etch ("after-etch" overlay measurement) would require an additional stand-alone measurement step, which is costly in terms of time. As a result of this, the feedback control loop for the lithographic process is based on after-develop overlay measurements rather than after-etch overlay measurements. Furthermore, it can be shown that after-etch measurements and after-develop measurements of the same target may differ. The actual relevant overlay is after-etch overlay, as the resist is removed in the etch step. This discrepancy between after-etch and after-develop measurements is largely as a result of the effect of the etching step on the target or due to stress release after the hard-mask removal by the etching process.

Figure 3:
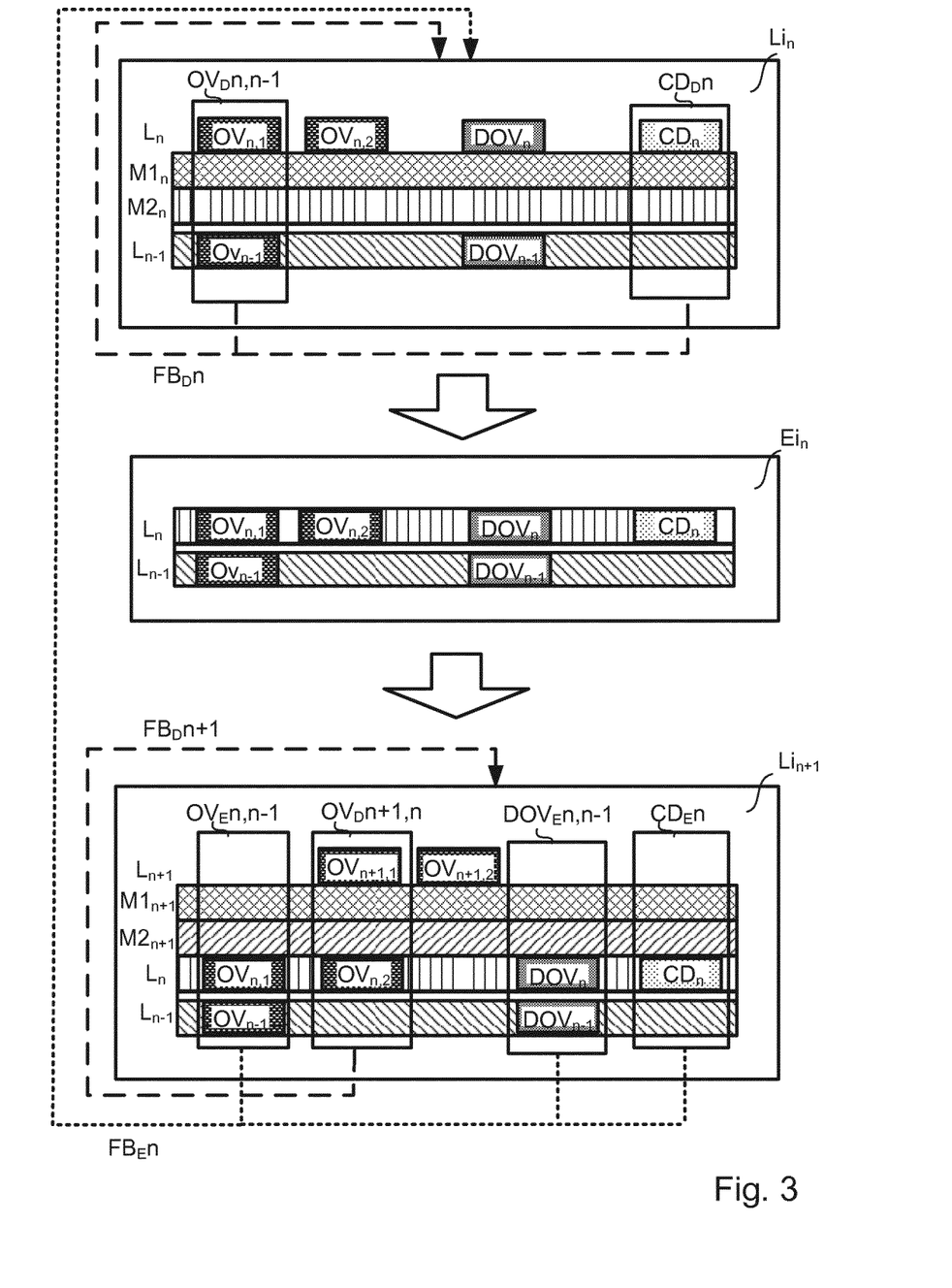
FIG. 3 depicts schematically three steps of a lithographic process in accordance with an embodiment of the invention.

In addition, there is a significantly greater distance between the relevant gratings forming an unetched overlay target (measured after-develop) compared to after-etch (this can be observed in FIG. 3). The effect of the gratings being closer together after-etch is that the signal coupling from the gratings is improved with a consequent improvement in measurement quality.

FIG. 3 schematically illustrates three steps of a method of performing after-etch metrology which does not require an additional stand-alone measurement step. In an embodiment, the method comprises measuring both previous layer overlay after-etch and (optionally) the current layer overlay (after-develop) during current lithography layer formation; that is measuring during formation of layer $L_{n+1}$ over layer $L_n$ and layer $L_{n-1}$:

(a) the overlay from the buried target (overlay of previous layer between layer $L_n$ and layer $L_{n-1}$)

(b) the overlay from the current layer (between layer $L_{n+1}$ and layer $L_n$).

This method performs the measurements using integrated metrology (e.g. a metrology apparatus integrated within the track of a litho cell). Such measurements are performed inline during processing of the substrate, usually immediately after the develop step but prior to the etch step. Such measurements can be performed simultaneously with the pre-processing (e.g., resist coating etc.) of a subsequent substrate during a lithographic process and therefore take up little or no additional time.

FIG. 3 shows three steps (in isolation as part of a longer process) of a lithographic process. The first block shows a part of a substrate following a first lithographic step $Li_n$ where a layer $L_n$ is exposed onto a previous layer $L_{n-1}$ which has already been formed and processed (developed and etched). Layer $L_n$ is shown after-develop (i.e., pre-etch) as resist structures over a masking layer $M1_n$ and the layer of material $M2_n$ into which layer $L_n$ will be ultimately etched following an etch step. In this specific example, layer $L_{n-1}$ comprises an overlay grating $OV_{n-1}$ and a product-resolution overlay grating $DOV_{n-1}$. Layer $L_n$, in this specific example, comprises a first overlay grating $OV_{n,1}$, exposed directly over the overlay grating $OV_{n-1}$ in layer $L_{n-1}$ thereby forming an overlay target, a second overlay grating $OV_{n,2}$, a product-resolution overlay grating $DOV_n$ exposed directly over the product-resolution overlay grating $DOV_{n-1}$ in layer $L_{n-1}$ thereby forming a product-resolution overlay target and a critical dimension target $CD_n$. The second block shows the substrate following an etch step $Ei_n$ The third block shows the substrate following a second lithographic step $Li_{n+1}$ where a layer $L_{n+1}$ is exposed onto layers $L_n$ and $L_{n+1}$. Layer $L_{n+1}$ is shown after-develop (i.e., pre-etch) as resist structures over a masking layer $M1_{n+1}$ and the layer of material $M2_{n+1}$ into which layer $L_{n+1}$ will be ultimately etched following an etch step. Layer $Li_{n+1}$, in this specific example, is shown to comprise a first overlay grating $OV_{n+1,1}$ exposed directly over the overlay grating $OV_{n,2}$ in layer $L_n$ thereby forming an overlay target and a second overlay grating $OV_{n+1,2}$. The second overlay grating $OV_{n+1,2}$ is formed to provide a lower constituent grating of an overlay target for measurement of overlay between layer $L_{n+1}$ and a subsequent layer and is therefore unnecessary if there are no subsequent layers.

The first lithographic step $Li_n$ schematically indicates that the after-develop overlay target formed from overlay gratings $OV_{n-1}$, $OV_{n,1}$ is measured to obtain after-develop overlay measurements $OV_D$n,n-1 between layers $L_n$ and $L_{n-1}$. Also CD target $CD_n$ is measured to obtain after-develop CD measurements $CD_D$n. These after-develop overlay and/or CD measurements are used in control loop $FB_D$n for control of lithographic step $Li_n$ on subsequent substrates. This after-develop control loop $FB_D$n is conventional in an integrated metrology system. Other types of targets may also be included in this layer, such as focus targets for measuring focus. Where a focus target is included in layer $L_n$, it can also be measured after-develop and used in a control loop for control of lithographic step $Li_n$ on subsequent substrates, as described.

The second lithographic step $Li_{n+1}$ schematically indicates that the after-etch overlay target formed from overlay gratings $OV_{n-1}$, $OV_{n,1}$ is measured to obtain after-etch overlay measurements $OV_E$n,n-1 between layers $L_n$ and $L_{n-1}$. The inventor has devised that this after-etch measurement can be performed during the lithographic step $Li_{n+1}$, following the pre-processing steps for this lithographic step. As such, the after-etch overlay measurements $OV_E$n,n-1 of two preceding layers are performed through the thin-film masking layer(s) $M1_{n+1}$ and the material layer $M2_{n+1}$ below this into which layer $L_{n+1}$ will be etched, during formation of layer $L_{n+1}$ (i e, immediately after-develop of layer $L_{n+1}$). Similarly, after-etch CD measurements $CD_E$n of layer $L_n$ and after-etch product-resolution overlay measurements $DOV_E$n,n-1 between layers $L_n$ and $L_{n-1}$ can be made during this step, as can after-etch focus measurements on focus targets in layer $L_n$, where present. The product-resolution overlay metrology will be described in more detail below. Additionally, as is shown, a more conventional after-develop overlay measurement $OV_D$n+1,n between layers $L_{n+1}$ and $L_n$ can be performed.

The after-etch overlay measurements $OV_E$n,n-1, after-etch product-resolution overlay measurements $DOV_E$n,n-1 and/or the after-etch CD measurements $CD_E$n can then be used in control loop $FB_E$n for control of overlay and/or CD in lithographic step $Li_n$ on subsequent substrates. The after-develop overlay measurement $OV_D$n+1,n can be used in control loop $FB_D$n+1 for control of lithographic step $Li_{n+1}$ on subsequent substrates.

It is known that there may be a discrepancy between overlay measurements performed on typical overlay targets, comprised of gratings having a pitch in the region of 500 nm, and actual overlay of product structures at product-resolution. This discrepancy may result in an offset between the measured overlay value from the overlay target and the actual overlay of the product structures. The reason that the overlay gratings have a larger pitch is that this enables the overlay target to be measured in resist (i.e., after-develop measurement). Performing an after-develop measurement on a product-resolution overlay grating is not possible as this small pitch, coupled with the distance between the gratings when the upper grating is in resist, means that there is no measurable first order signal, while the zeroth order signal is unstable over such a distance. The methods disclosed herein result in product-resolution overlay gratings $DOV_n$, $DOV_{n-1}$ being measurable to obtain a measure of the product-resolution overlay. A product resolution grating may be, for example, a grating having a pitch smaller than 100 nm, for example between 40-80 nm. This is because the overlay target can be measured after-etch and will therefore now only comprise a small distance between the constituent gratings $DOV_n$, $DOV_{n-1}$. This enables the zeroth order signal to be measured with sufficient accuracy. It should be noted that, instead of dedicated overlay gratings, these after-etch measurements may be performed directly on product structures (this also applies to CD measurements). As such, the term "target" should be understood to include product structures.

It may be that the product-resolution overlay targets are used instead of more conventional, larger pitch overlay targets, although this would mean that they could not be used for after-develop measurement and control loops. Alternatively, they can be used in combination with larger pitch overlay targets. For example, it may be that the offset between measurements of overlay from larger pitch overlay targets and from product-resolution overlay targets is determined and used to correct subsequent measurements of larger pitch overlay targets. In such an embodiment, the product-resolution overlay targets may be measured (either inline on an integrated metrology apparatus or separately on a stand-alone metrology apparatus) and the offset determined and used to improve measurement accuracy of more standard overlay targets formed and measured as described herein. Such an offset may be determined, for example, on a per-layer combination, per-substrate or per-lot basis as appropriate.

It should be appreciated that the concepts described here are not limited to any one or combination of types of measurements (e.g., overlay or CD) or types of targets. Of importance is the principle of after-etch measurement of a target formed in one or more preceding layers, performed during the lithographic processes forming a subsequent layer. The targets may include one or any combination of overlay targets, product-resolution overlay targets, focus targets and/or CD targets. One or more targets may be dual or multiple measurement type targets, usable for different types of measurement on a single target. Such targets may be used for any two or more of overlay measurements, product-resolution overlay measurements, focus measurements and/or CD measurements.

Different layers may comprise different combinations of different types of targets (or their constituent structures). For example, in an embodiment an offset between after-etch measurements and after-develop measurements may be determined and used to correct subsequent after-develop measurements, thereby removing the need to perform after-etch measurements in every case. Such an offset may be determined, for example, on a per-layer (or layer combination), per-substrate or per-lot basis as appropriate.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to structural asymmetry.

The program may optionally be arranged to control the optical system, substrate support and the like to perform the steps S2-S5 for measurement of asymmetry on a suitable plurality of targets.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The embodiments may further be described using the following clauses:

1. A method of measuring a target comprising: measuring said target subsequent to exposure of structures by a lithographic process in a current layer on a substrate over one or more preceding layers, wherein said one or more preceding layers have each undergone an etch step, and wherein said target is comprised only in at least one of said one or more preceding layers, thereby obtaining an after-etch measurement of said target.

2. A method according to clause 1, wherein said measuring step is performed after a develop step of said current layer.

3. A method according to clause 1 or 2, wherein said measuring step is performed through the layer that the current layer is to be etched into and/or a masking layer prior to etching of said current layer.

4. A method according to any preceding clause, wherein said target comprises an overlay target for measuring overlay between a first layer of said preceding layers and a second layer of said preceding layers, said overlay target comprising a first structure in said first layer and a second structure overlaying said first structure in said second layer.

5. A method according to clause 4, wherein said first structure and second structure each have a resolution smaller than 100 nm.

6. A method according to clause 5, wherein said method comprises additionally measuring an overlay target comprising structures with a resolution larger than 100 nm and also comprised within said first layer and said second layer; determining an offset between the measurement of said overlay target comprising structures with a resolution smaller than 100 nm and the measurement of said overlay target comprising structures with a resolution larger than 100 nm; and using said offset to correct subsequent after-etch measurements of overlay targets comprising structures with a resolution larger than 100 nm.

7. A method according to any preceding clause, wherein said target comprises a critical dimension target in one said preceding layers for measuring critical dimension in said layer.

8. A method according to any preceding clause, wherein said method comprises performing an initial measurement of said target before an etch step is performed on the uppermost layer in which it is formed;
determining an offset between the initial measurement of the target and the after-etch measurement of the target; and
using said offset to correct subsequent measurements of targets performed before an etch step is performed on the uppermost layer in which the target is formed.

9. A method according to any preceding clause, comprising using said after-etch measurement in controlling a lithographic process forming the appropriate one or more preceding layers corresponding to the layer(s) said target is formed in, on subsequent substrates.

10. A method according to any preceding clause, comprising performing said after-etch measurement during pre-processing of one or more subsequent substrates.

11. A method according to any preceding clause, comprising:
measuring an unprocessed target at least partially formed in said current layer in a single measurement cycle with said after-etch measurement, to obtain a measurement of the unprocessed target; and
using said measurement of the unprocessed target in controlling a lithographic process forming the current layer on subsequent substrates.

12. A method according to any preceding clause, wherein said target comprises a focus target in one said preceding layers for measuring focus in said layer.

13. A method of performing a lithographic process comprising:
performing lithography steps to form structures in one or more preceding layers on a substrate, at least one of said preceding layers comprising a target;
performing an etch step on said one or more preceding layers;
exposing a current layer over said one or more preceding layers; and subsequent to these steps:
measuring said target to obtain an after-etch measurement of said target.

14. A method according to clause 13, comprising, between said exposing and measuring steps, performing a develop step on said substrate to develop said current layer.

15. A method according to clause 13 or 14, wherein said measuring step is performed through the layer that the current layer is to be etched into and/or a masking layer prior to etching of said current layer.

16. A method according to any of the clauses 13 to 15, wherein said target comprises an overlay target for measuring overlay between a first layer of said preceding layers and a second layer of said preceding layers, said overlay target comprising a first structure in said first layer and a second structure overlaying said first structure in said second layer.

17. A method according to clause 16, wherein said first structure and second structure each have a resolution smaller than 100 nm.

18. A method according to clause 17, wherein said method comprises additionally measuring an overlay target comprising structures with a resolution larger than 100 nm and also comprised within said first layer and said second layer;
determining an offset between the measurement of said overlay target comprising structures with a resolution smaller than 100 nm and the measurement of said overlay target comprising structures with a resolution larger than 100 nm; and
using said offset to correct subsequent after-etch measurements of overlay targets comprising structures with a resolution larger than 100 nm.

19. A method according to any of clauses 13 to 18, wherein said target comprises a critical dimension target in one said preceding layers for measuring critical dimension in said layer.

20. A method according to any of clauses 13 to 19, wherein said target comprises a focus target in one said preceding layers for measuring focus in said layer.

21. A method according to any of clauses 13 to 20, wherein said method comprises performing an initial measurement of said target during its formation and before an etch step is performed on the uppermost layer in which it is formed;
determining an offset between the initial measurement of the target and the after-etch measurement of the target; and
using said offset to correct subsequent measurements of targets performed before an etch step is performed on the uppermost layer in which the target is formed.

22. A method according to any of clauses 13 to 21, using said after-etch measurement in controlling the lithographic process when forming the appropriate one or more preceding layers corresponding to the layer(s) said target is formed in, on subsequent substrates.

23. A method according to any of clauses 13 to 22, comprising performing said after-etch measurement during pre-processing of one or more subsequent substrates 24. A method according to any of clauses 13 to 23, comprising making measurements of an unprocessed target at least partially formed in said current layer in parallel with said after-etch measurements of said target formed in one or more preceding layers; and
using said measurements of the unprocessed target in controlling the lithographic process when forming the current layer on subsequent substrates.

25. A computer program comprising processor readable instructions which, when run on suitable processor controlled apparatus, cause the processor controlled apparatus to perform the method of any preceding clause.

26. A computer program carrier comprising the computer program of clause 25.

27. A lithographic cell comprising a lithographic apparatus and a metrology apparatus, said lithographic cell being operable to perform the method of any of clauses 1 to 24.

28. A lithographic cell according to clause 27, wherein said metrology apparatus comprises:
an illumination system configured to illuminate with radiation a combined target produced using the lithographic process on the substrate;
a detection system configured to detect scattered radiation arising from illumination of the combined target.

29. A lithographic cell according to clause 27 or 28, wherein said lithographic apparatus comprises:
an illumination optical system arranged to illuminate a pattern;
a projection optical system arranged to project an image of the pattern onto a substrate.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   measuring a target subsequent to exposure of structures by a lithographic process in a current layer on a substrate, the current layer overlaying one or more preceding layers,
   wherein the one or more preceding layers have each undergone an etch step, and
   wherein the target is comprised only in at least one of the one or more preceding layers and the target comprises a first structure overlying a second structure, thereby obtaining an after-etch measurement of the target.

2. The method as claimed in claim 1, wherein the measuring is performed after a development step of the current layer.

3. The method as claimed in claim 1, wherein the measuring is performed through the layer that the current layer is to be etched into and/or a masking layer prior to etching of the current layer.

4. The method as claimed in claim 1, wherein the target comprises an overlay target for measuring overlay between a first layer of the preceding layers and a second layer of the preceding layers, the overlay target comprising the first structure in the first layer and the second structure, in the second layer, overlaying the first structure.

5. The method as claimed in claim 4, wherein the first structure and second structure each have a resolution smaller than 100 nm, and further comprising:
   additionally measuring an overlay target comprising structures with a resolution larger than 100 nm and also comprised within the first layer and the second layer;
   determining an offset between the measurement of the overlay target comprising structures with a resolution smaller than 100 nm and the measurement of the overlay target comprising structures with a resolution larger than 100 nm; and
   using the offset to correct subsequent after-etch measurements of overlay targets comprising structures with a resolution larger than 100 nm.

6. The method as claimed in claim 1, wherein the target comprises a critical dimension target in one of the preceding layers, for measuring critical dimension in the layer.

7. The method as claimed in claim 1, further comprising:
   performing an initial measurement of the target before an etch step is performed on the uppermost layer in which it is at least partly formed;
   determining an offset between the initial measurement of the target and the after-etch measurement of the target; and
   using the offset to correct subsequent measurements of targets performed before an etch step is performed on the uppermost layer in which the target is at least partly formed.

8. The method as claimed in claim 1, comprising using the after-etch measurement in controlling a lithographic process forming the appropriate one or more preceding layers corresponding to the layer(s) the target is formed in, on one or more subsequent substrates.

9. The method as claimed in claim 1, comprising performing the after-etch measurement during pre-processing of one or more subsequent substrates.

10. The method as claimed in claim 1, further comprising:
    measuring an unprocessed target at least partially formed in the current layer in a single measurement cycle with the after-etch measurement, to obtain a measurement of the unprocessed target; and
    using the measurement of the unprocessed target in controlling a lithographic process forming the current layer on one or more subsequent substrates.

11. The method as claimed in claim 1, wherein the target comprises a focus target in one of the preceding layers, for measuring focus for the layer.

12. A method of performing a lithographic process, the method comprising:
    performing lithography steps to form structures in one or more preceding layers on a substrate, at least one of the preceding layers comprising at least part of a target, the target comprises a critical dimension target in at least one of the preceding layers, for measuring critical dimension in the layer and/or comprises a focus target in at least one of the preceding layers, for measuring focus for the layer;
    performing an etch step on the one or more preceding layers;
    exposing a current layer over the one or more preceding layers; and
    subsequent to these steps:
    measuring the critical dimension target to obtain an after-etch measurement of critical dimension from the target and/or the focus target to obtain an after-etch measurement of focus from the target.

13. The method as claimed in claim 12, further comprising:
    measuring an unprocessed target at least partially formed in the current layer in parallel with the after etch measurement of the target formed in one or more preceding layers; and
    using the measurement of the unprocessed target in controlling the lithographic process when forming the current layer on one or more subsequent substrates.

14. A non-transitory computer program product comprising processor readable instructions which, when run on suitable processor controlled apparatus, cause the processor controlled apparatus to at least:
    measure a target subsequent to exposure of structures by a lithographic process in a current layer on a substrate over one or more preceding layers,
    wherein the one or more preceding layers have each undergone an etch step, and
    wherein the target is comprised only in at least one of the one or more preceding layers and the target comprises a first structure overlying a second structure, thereby obtaining an after-etch measurement of the target.

15. A lithographic cell comprising a lithographic apparatus and a metrology apparatus, the lithographic cell comprising the computer program product of claim 14.

16. The computer program product as claimed in claim 14, wherein the measurement is performed after a development step of the current layer.

17. The computer program product as claimed in claim 14, wherein the measurement is performed through the layer that the current layer is to be etched into and/or a masking layer prior to etching of the current layer.

18. The computer program product as claimed in claim 14, wherein the target comprises an overlay target for measuring overlay between a first layer of the preceding layers and a second layer of the preceding layers, the overlay target comprising the first structure in the first layer and the second structure, in the second layer, overlaying the first structure.

19. The computer program product as claimed in claim 18, wherein the first structure and second structure each have a resolution smaller than 100 nm, and the instructions are further configured to cause the processor controlled apparatus to:
additionally measure an overlay target comprising structures with a resolution larger than 100 nm and also comprised within the first layer and the second layer;
determine an offset between the measurement of the overlay target comprising structures with a resolution smaller than 100 nm and the measurement of the overlay target comprising structures with a resolution larger than 100 nm; and
enable use of the offset to correct subsequent after-etch measurements of overlay targets comprising structures with a resolution larger than 100 nm.

20. The computer program product as claimed in claim 14, wherein the instructions are further configured to cause the processor controlled apparatus to:
perform an initial measurement of the target before an etch step is performed on the uppermost layer in which it is at least partly formed;
determine an offset between the initial measurement of the target and the after-etch measurement of the target; and
enable use of the offset to correct subsequent measurements of targets performed before an etch step is performed on the uppermost layer in which the target is at least partly formed.

\* \* \* \* \*